(12) United States Patent
Kim et al.

(10) Patent No.: US 6,775,147 B2
(45) Date of Patent: Aug. 10, 2004

(54) MODULAR SPRING LOADED PCI CARD RETAINING DEVICE

(75) Inventors: David Kwang Jae Kim, San Jose, CA (US); William W. Ruckman, San Jose, CA (US); Wenjun William Chen, Fremont, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 10/273,040

(22) Filed: Oct. 17, 2002

(65) Prior Publication Data

US 2004/0109297 A1 Jun. 10, 2004

(51) Int. Cl.[7] .................................................. H05K 5/00
(52) U.S. Cl. ...................... 361/752; 361/759; 211/41.17
(58) Field of Search ................................ 361/752, 754, 361/756, 759, 796, 798, 801, 802, 683, 684; 70/208; 403/24, 409.1; 211/26, 41.7

(56) References Cited

U.S. PATENT DOCUMENTS

| | | | | |
|---|---|---|---|---|
| 5,621,890 A | * | 4/1997 | Notarianni et al. | ......... 710/303 |
| 6,173,843 B1 | * | 1/2001 | Christensen et al. | ...... 211/41.17 |
| 6,304,456 B1 | * | 10/2001 | Wortman | ..................... 361/796 |
| 6,437,992 B1 | * | 8/2002 | Carney et al. | ............... 361/796 |
| 6,442,037 B1 | * | 8/2002 | Boe | ........................... 361/759 |
| 6,549,428 B1 | * | 4/2003 | Fontana et al. | ............. 361/825 |

* cited by examiner

Primary Examiner—David Martin
Assistant Examiner—Thanh S. Phan
(74) Attorney, Agent, or Firm—Blakely Sokoloff Taylor & Zafman LLP

(57) ABSTRACT

According to one embodiment, a computer system is disclosed. The computer system includes an enclosure and a card retaining assembly. The card training assembly is mounted within the enclosure to support printed circuit boards (PCBs). The card retaining assembly includes a housing, mounted within the enclosure that has one or more cavities. In addition, the card retaining assembly includes one or more retaining devices configured to be inserted into the one or more cavities in order to support the PCBs

23 Claims, 6 Drawing Sheets

MODULAR SPRING LOADED PCI CARD RETAINING DEVICE

FIELD OF THE INVENTION

The present invention relates to computer systems; more particularly, the present invention relates to printed circuit board retaining devices.

BACKGROUND

Computers are typically manufactured to include one or more connectors to secure Peripheral Component Interface (PCI) expansion cards. PCI cards increase the capacity of the computer system. A computer enclosure PCI panel is often formed with an opening for insertion and withdrawal of the PCI cards. The card has a cover that blocks the opening after the card has been plugged in.

Normally, a foam pad is used to hold down a PCI card on the motherboard. However, as computer systems including plug in PCI cards increase in power and performance, the mass of the cards increases. As the mass increases, it becomes more difficult to hold a particular PCI card in its connector on the motherboard.

Therefore, a mechanism to hold PCI connectors on a motherboard is desired.

SUMMARY

According to one embodiment, a computer system is disclosed. The computer system includes an enclosure and a card retaining assembly. The card retaining assembly is mounted within the enclosure to support printed circuit boards (PCBs). The card retaining assembly includes a housing, mounted within the enclosure that has one or more cavities. In addition, the card retaining assembly includes one or more retaining devices configured to be inserted into the one or more cavities in order to support the PCBs.

In a further embodiment, the housing cavities include a space to accommodate PCBs of different heights, and each space includes a stopper and grooves to support the retaining devices and to guide the retaining devices to into the housing. In yet a further embodiment, each retaining device includes grooves to match the grooves of the housing spaces and a snap to enable the retaining device to be mounted in the housing.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A modular card retaining assembly is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
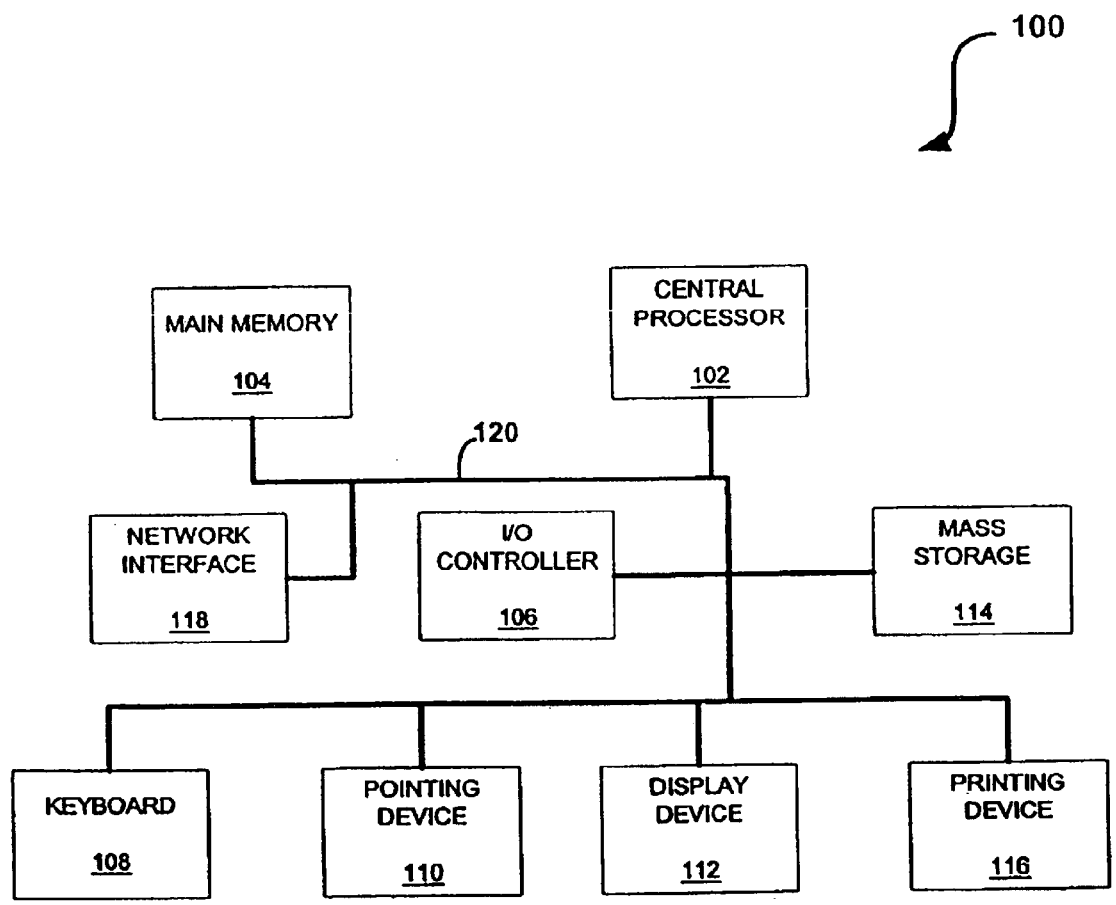
FIG. 1 illustrates one embodiment of a computer system.

FIG. 1 illustrates one embodiment of a computer system 100 in which the present invention may be embodied. Computer system 100 comprises a central processor 102, a main memory 104, an input/output (I/O) controller 106, a keyboard 108, a pointing device 110 (e.g., mouse, track ball, pen device, or the like), a display device 112, a mass storage 114 (e.g., a nonvolatile storage such as a hard disk, an optical drive, and the like), and a network interface 118. Additional input/output devices, such as a printing device 116, may be included in the system 100 as desired. As illustrated, the various components of the system 100 communicate through a system bus 120 or similar architecture.

In an embodiment, the computer system 100 includes a Sun Microsystems computer utilizing a SPARC microprocessor available from several vendors (including Sun Microsystems of Palo Alto, Calif.). Those with ordinary skill in the art understand, however, that any type of computer system may be utilized to embody the present invention, including those made by Hewlett Packard of Palo Alto, Calif., and IBM-compatible personal computers utilizing Intel microprocessor, which are available from several vendors (including IBM of Armonk, N.Y.).

Also, instead of a single processor, two or more processors (whether on a single chip or on separate chips) can be utilized to provide speedup in operations. It is further envisioned that the processor 102 may be a complex instruction set computer (CISC) microprocessor, a reduced instruction set computing (RISC) microprocessor, a very long instruction word (VLIW) microprocessor, a processor implementing a combination of instruction sets, and the like.

The network interface 118 provides communication capability with other computer systems on a same local network, on a different network connected via modems and the like to the present network, or to other computers across the Internet. In various embodiments, the network interface 118 can be implemented utilizing technologies including, but not limited to, Ethernet, Fast Ethernet, wide-area network (WAN), leased line (such as T1, T3, optical carrier 3 (OC3), and the like), analog modem, digital subscriber line (DSL and its varieties such as high bit-rate DSL (HDSL), integrated services digital network DSL (IDSL), and the like), cellular, time division multiplexing (TDM), universal serial bus (USB and its varieties such as USB II), asynchronous transfer mode (ATM), satellite, cable modem, and/or FireWire.

Moreover, the computer system 100 may utilize operating systems such as Solaris, Windows (and its varieties such as CE, NT, 2000, XP, ME, and the like), HP-UX, IBM-AIX, PALM, UNIX, Berkeley software distribution (BSD) UNIX, Linux, Apple UNIX (AUX), Macintosh operating system (Mac OS) (including Mac OS X), and the like. Also, it is envisioned that in certain embodiments, the computer system 100 is a general purpose computer capable of running any number of applications such as those available from companies including Oracle, Siebel, Unisys, Microsoft, and the like.

Figure 2:
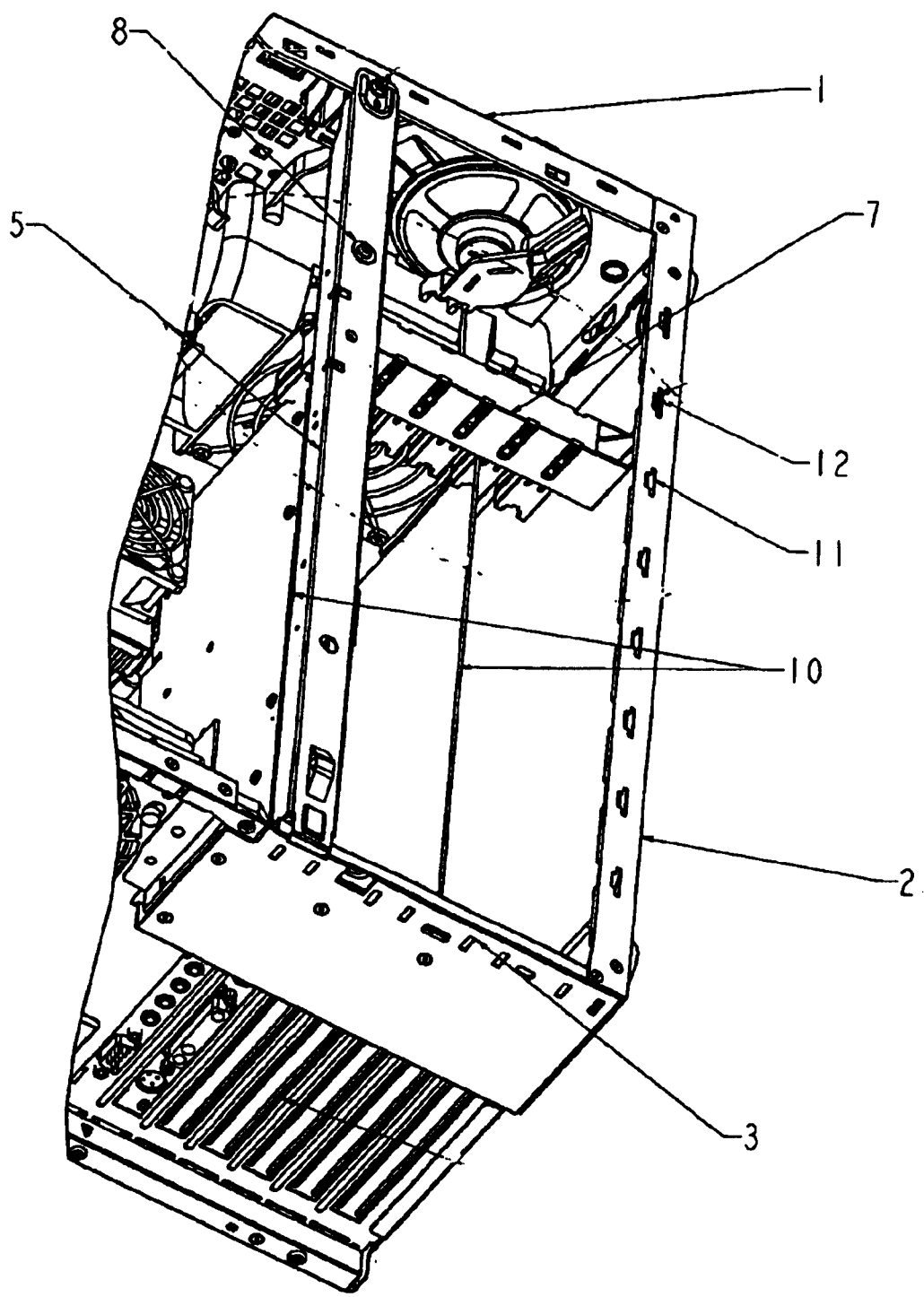
FIG. 2 illustrates one embodiment of a computer system enclosure.

FIG. 2 illustrates one embodiment of a computer system 100 enclosure. The enclosure includes a front section 1, a rear section 2, a bottom section 3, and a top section (not shown). In addition, the enclosure includes a link bar 5 that spans across top section 2 and bottom section 3 to support the mechanical structure of the enclosure.

According to one embodiment, the enclosure includes a card retaining assembly 7. Retaining assembly 7 is a modular, spring-loaded device that functions to retain printed circuit boards, such as a peripheral component interface (PCI) card 10. In one embodiment, retaining assembly 7 can be assembled on link bar 5 using a common screw 8 and a tab 12 inserted into a slot 11 provided in the rear section 2 of the enclosure.

Figure 3:
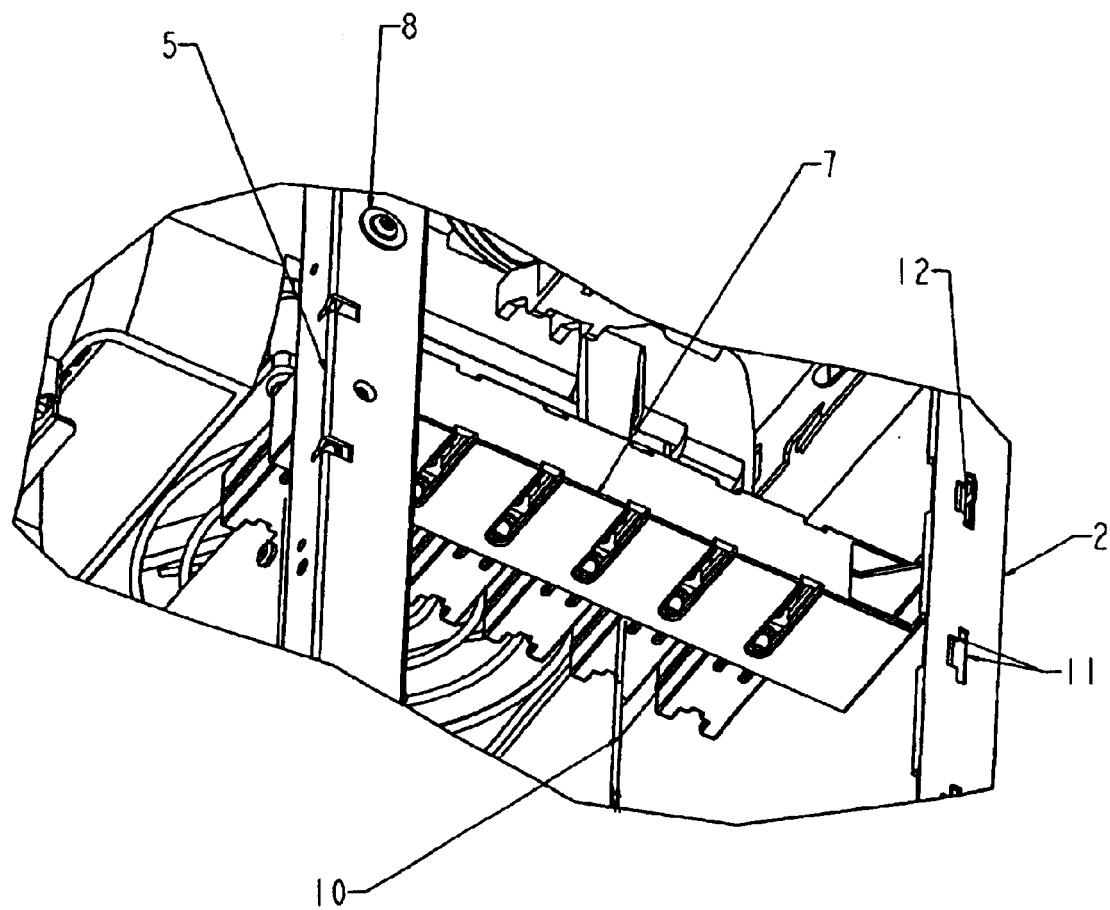
FIG. 3 illustrates a close-up view of one embodiment of a card retaining assembly within a computer system enclosure.

FIG. 3 illustrates a close-up view of one embodiment of card retaining assembly 7 within the computer system enclosure. This view shows the tab 12 of card retaining assembly 7 mounted within slot 11 on rear section 2. In addition, more detail is shown of retaining assembly 7 holding PCI card 10.

Figure 5:
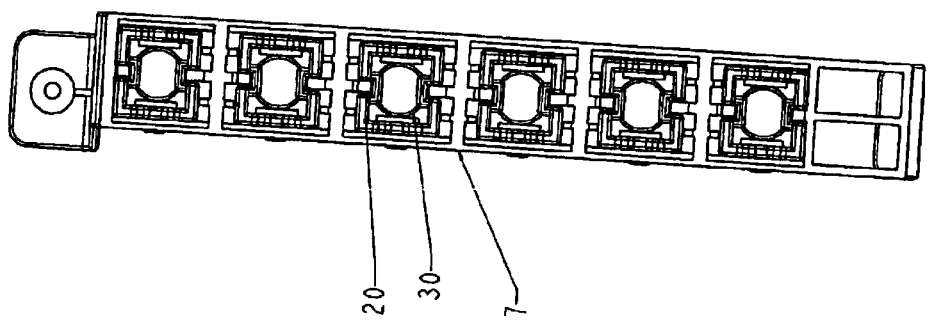
FIG. 5 illustrates a front view of one embodiment of a card retaining assembly.
Figure 4:
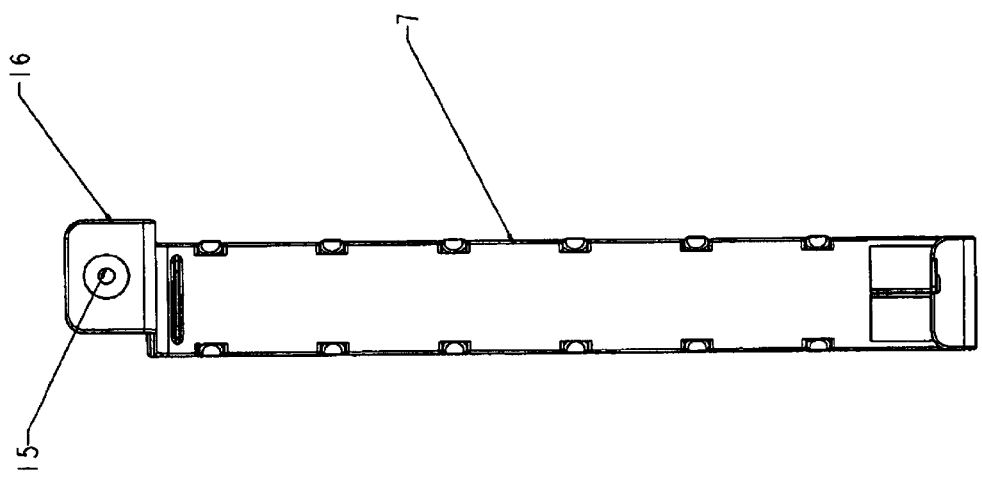
FIG. 4 illustrates a rear view of one embodiment of a card retaining assembly.

FIG. 4 illustrates a rear view of one embodiment of card retaining assembly 7. Card retaining assembly 7 includes a housing 16. According to one embodiment, housing 16 is mounted to the enclosure via a screw 15. FIG. 5 illustrates a front view of one embodiment of card retaining assembly 7. In this view, card retaining assembly 7 is shown to include a multitude of retaining devices 20 mounted within housing 16.

Each retaining device 20 is used to hold a PCI card mounted in computer system 100. In addition, each retaining device 20 includes a spring 30 that functions as a shock absorber in order to hold the PCI cards in place to prevent backing out of retaining devices 20 due to shock and vibration.

Figure 6:
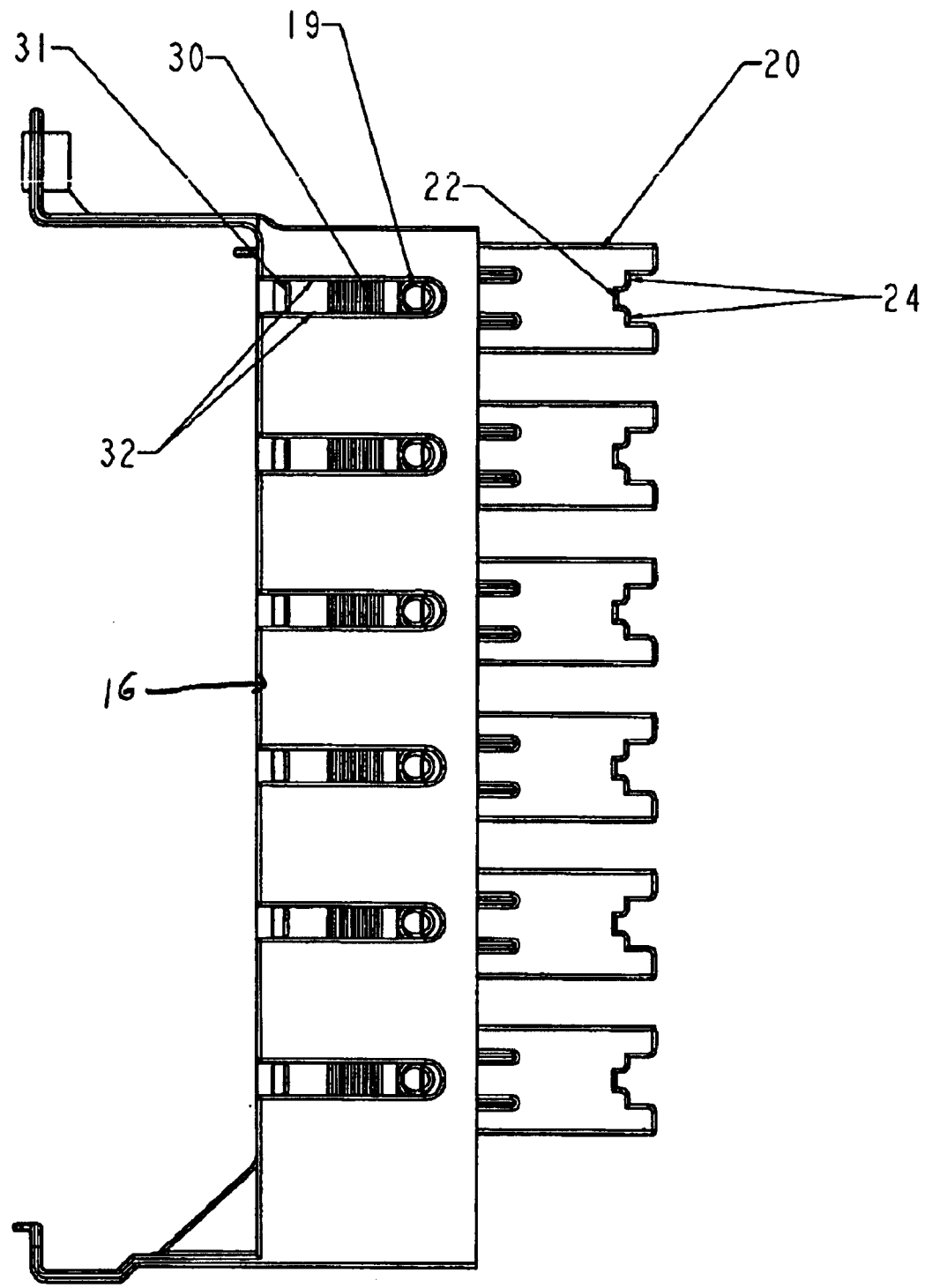
FIG. 6 illustrates a side view of one embodiment of a card retaining assembly.

FIG. 6 illustrates a side view of one embodiment of card retaining assembly 7. FIG. 6 shows a detailed view of retaining devices 20 and associated springs 30. According to one embodiment, each retaining device 20 includes a snap 19 that enables the retaining device 20 to be mounted within housing 16. In addition, housing 16 includes spaces 32 wherein each spring 30 is housed.

Spaces 32 enable each retaining device 20/spring 30 assembly to retract within housing 16 to accommodate PCI cards of various heights. Each space 32 includes a stopper 31 to support each spring 30. The stoppers 31 serve as blocking mechanisms to prevent the retaining devices 20 from retracting further within housing 16. Retaining devices 20 each include a slot 24 that is used to rest on the top of the PCI cards. The slots 24 guard and support a PCI card. Supports 22 are included within the gap of each slot 24 and presses down on the top of the PCI cards.

Figure 7:
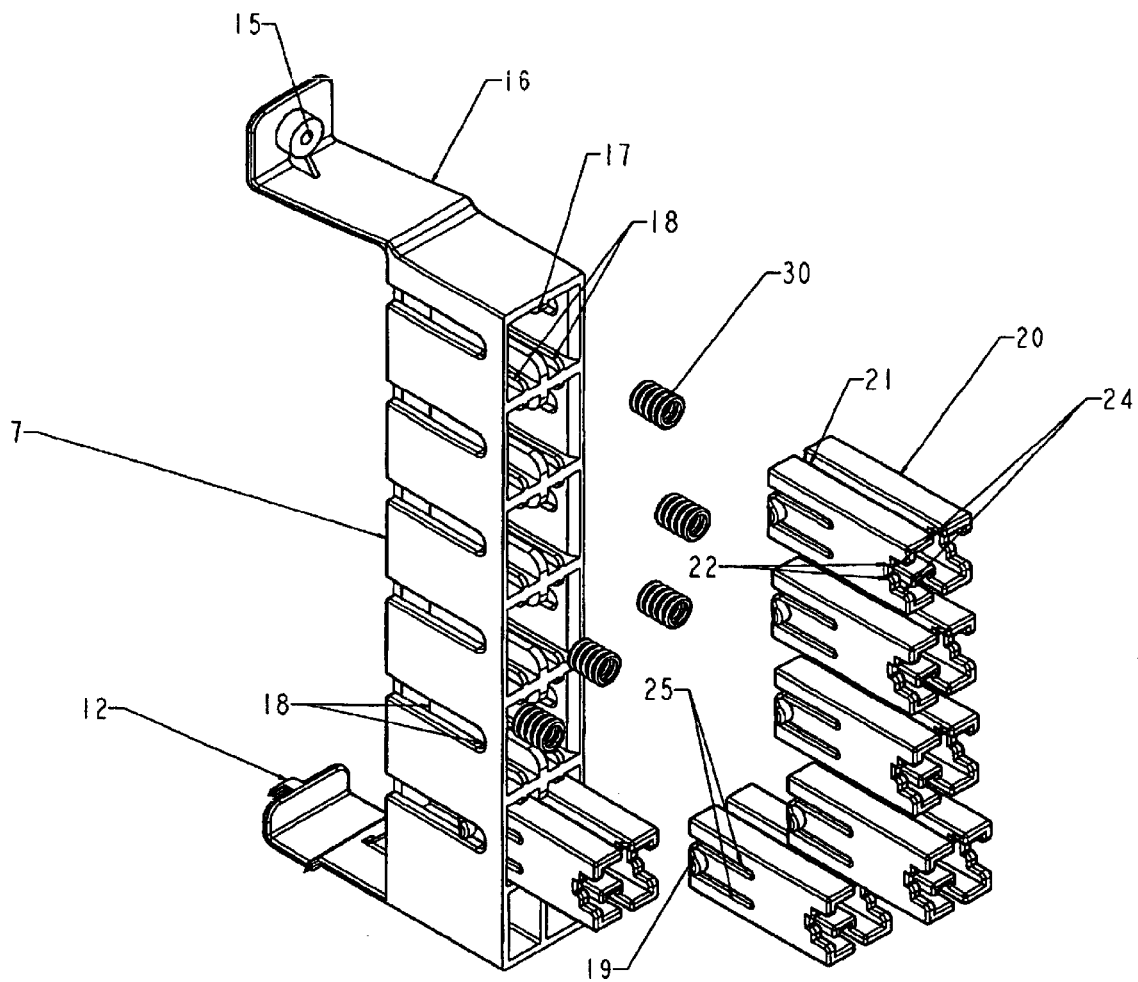
FIG. 7 illustrates an exploded view of one embodiment of a card retaining assembly.

FIG. 7 illustrates an exploded view of one embodiment of card retaining assembly 7. In this figure grooves 17 and 18 within housing 16 are shown. According to one embodiment, grooves 17 and 18 are used to support and guide retaining devices 20 in to housing 16 to reduce the unnecessary movement retaining devices 20.

Moreover, retaining devices 20 includes a groove 21 to match a groove 17 of housing 16. In one embodiment, the length of the groove 21 can be extended depending on the desired travel length to accommodate the different PCI card heights. As described above, retaining devices 20 include snaps 19 that are used to retain the devices 20 within housing 16.

In one embodiment, retaining devices 20 also include a spring mechanism 25 that enable the retaining devices 20 to be guided into housing 16 by squeezing. Once a snap 19 is inserted into a groove 18, the spring mechanism 25 expands and locks snap 19 into groove 18. Thus, the snap 19 and spring mechanism 25 enable a retaining device 20 to be installed and removed without the use of any tools.

The above-described invention provides a spring loaded, modular PCI card retaining device that is attached to an enclosure. The card retaining device can accommodate the various height of PCI cards.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. A computer system comprising:
    an enclosure; and
    a card retaining assembly mounted within the enclosure to support printed circuit boards (PCBs), the card retaining assembly including:
        a housing, mounted within the enclosure, having one or more cavities, each of the one or more cavities having grooves; and
        one or more retaining devices configured to be inserted into the one or more cavities via the grooves in order to support the PCBs, including a first retaining device to accommodate a first PCB having a first height and a second retaining device to accommodate a second PCB having a second height.

2. The computer system of claim 1 wherein a stopper is mounted within each space.

3. The computer system of claim 1 wherein each retaining device includes one or more grooves.

4. The computer system of claim 3 wherein the one or more grooves enable each retaining device to be guided into the housing grooves.

5. The computer system of claim 3 wherein each retaining device includes one or more grooves to match the grooves of the housing spaces.

6. The computer system of claim 5 wherein each retaining device comprises a snap to enable the retaining device to be mounted in the housing.

7. The computer system of claim 6 wherein each retaining device includes a spring mechanism that enables the retaining device to be guided into the housing.

8. The computer system of claim 7 wherein each retaining device comprises a spring to prevent a PCB from being withdrawn from the retaining device upon the housing being vibrated.

9. The computer system of claim 1 wherein the one or more PCBs are Peripheral Component Interface (PCI) cards.

10. A card retaining assembly comprising:
    a housing having a plurality of cavities, each of the cavities having grooves; and
    a plurality of retaining devices configured to be inserted into the plurality of cavities via the grooves in order to support Peripheral Component Interface (PCI) cards, including a first retaining device to accommodate a first PCB having a first height and a second retaining device to accommodate a second PCB having a second height.

11. The card retaining assembly of claim 10 wherein a stopper is mounted within each space.

12. The card retaining assembly of claim 10 wherein each retaining device includes one or more grooves.

13. The card retaining assembly of claim 12 wherein the one or more grooves enable each retaining device to be guided into the housing.

14. The card retaining assembly of claim 12 wherein each retaining device includes one or more grooves to match the grooves of the housing spaces.

15. The card retaining assembly of claim 14 wherein each retaining device comprises a snap to enable the retaining device to be mounted in the housing.

16. The card retaining assembly of claim 15 wherein each retaining device includes a spring mechanism that enables the retaining device to be guided into the housing.

17. The card retaining assembly of claim 16 wherein each retaining device comprises a spring to prevent a PCI card from being withdrawn from the retaining device upon the housing being vibrated.

18. A computer system comprising:
   an enclosure; and
   a card retaining assembly mounted within the enclosure to support printed circuit boards (PCBs), the card retaining assembly including:
      a housing, mounted within the enclosure, having one or more cavities; and
      one or more retaining devices configured to be inserted into the one or more cavities in order to support the PCBs, wherein a first retaining device accommodates a first PCB having a first height and a second retaining device accommodates a second PCB having a second height.

19. The computer system of claim 18 wherein each retaining device includes a stopper.

20. The computer system of claim 18 wherein each retaining device includes one or more grooves.

21. The computer system of claim 20 wherein the one or more grooves enable each retaining device to be guided into the housing.

22. The computer system of claim 18 wherein each retaining device comprises a snap to enable the retaining device to be mounted in the housing.

23. The computer system of claim 18 wherein each retaining device includes a spring mechanism that enables the retaining device to be guided into the housing.

* * * * *